United States Patent
Harrison et al.

(10) Patent No.: US 6,521,479 B1
(45) Date of Patent: Feb. 18, 2003

(54) REPACKAGING SEMICONDUCTOR IC DEVICES FOR FAILURE ANALYSIS

(75) Inventors: Ray D. Harrison, Garland, TX (US); Jianbai Zhu, Plano, TX (US); Kendall S. Wills, Sugarland, TX (US); Willmar Subido, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/044,024

(22) Filed: Jan. 11, 2002

Related U.S. Application Data

(60) Provisional application No. 60/343,929, filed on Dec. 28, 2001.

(51) Int. Cl.[7] .......................... H01L 21/66; H01L 21/30; H01L 21/302; H01L 29/40; H01L 23/495
(52) U.S. Cl. .......................... 438/106; 438/14; 438/15; 438/459; 438/458; 438/689; 257/778; 257/777; 257/29; 257/666
(58) Field of Search ............................ 438/14, 15, 459, 438/458, 689; 257/777, 778, 29, 666

(56) References Cited

U.S. PATENT DOCUMENTS

| | | | |
|---|---|---|---|
| 5,424,254 A | * | 6/1995 | Damiot ........................ 438/106 |
| 6,020,748 A | * | 2/2000 | Jeng ............................ 324/755 |
| 6,096,568 A | * | 8/2000 | Dobrovolski ............... 438/124 |
| 6,245,586 B1 | | 6/2001 | Colvin |
| 6,249,052 B1 | * | 6/2001 | Lin ............................. 257/734 |
| 6,329,212 B1 | * | 12/2001 | Dobrovolski ................ 438/14 |
| 6,331,453 B1 | * | 12/2001 | Bolken et al. .............. 438/106 |

FOREIGN PATENT DOCUMENTS

| | | | |
|---|---|---|---|
| JP | 64-65860 | * | 3/1989 |
| JP | 08-203939 | * | 8/1996 |
| JP | 08-222592 | * | 8/1996 |

* cited by examiner

Primary Examiner—David E. Graybill
Assistant Examiner—James Mitchell
(74) Attorney, Agent, or Firm—Wade James Brady, III; Frederick J. Telecky, Jr.

(57) ABSTRACT

The present invention provides a system and method for preparing semiconductor integrated circuits ("ICs"), particularly ball grid arrays ("BGAs"), quad flat packs ("QFPs") and dual in line packages ("DIPs") for failure analysis ("FA") using a variety of techniques, including emission microscopy ("EM") and externally induced voltage alteration ("XIVA"). This system and method requires precision thinning and polishing of the semiconductor IC device to expose the backside of the die and mounting of the semiconductor device on a secondary package assembly.

37 Claims, 4 Drawing Sheets

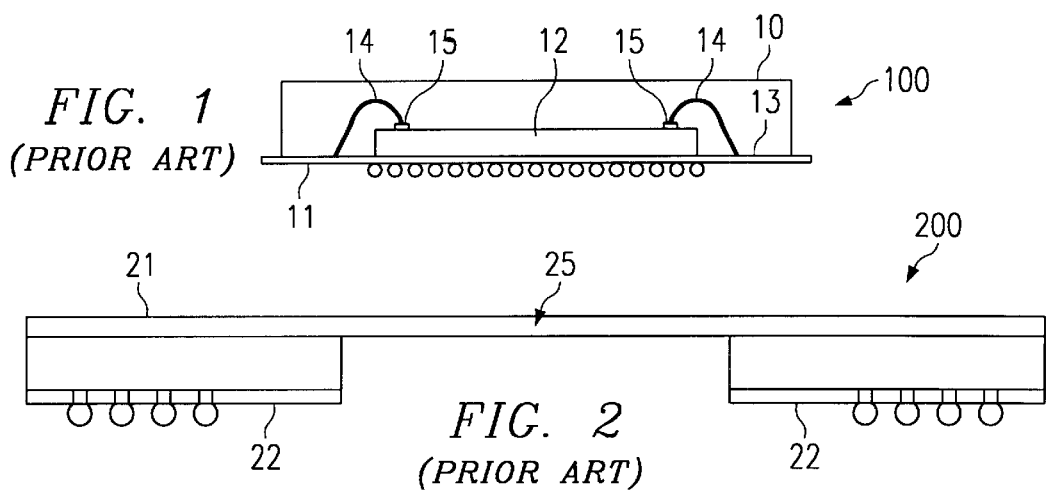
FIG. 1 (PRIOR ART)
FIG. 2 (PRIOR ART)
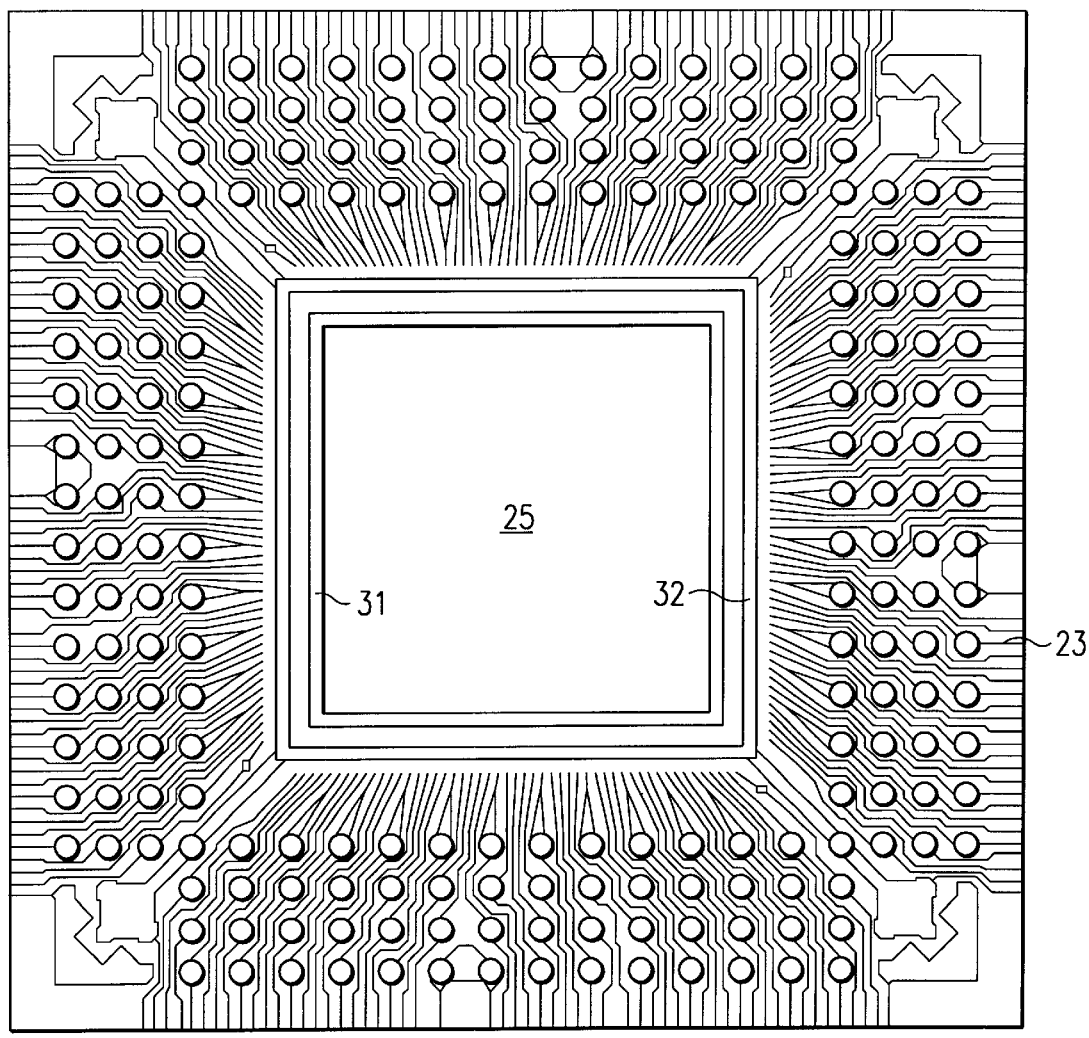
FIG. 3 (PRIOR ART)

REPACKAGING SEMICONDUCTOR IC DEVICES FOR FAILURE ANALYSIS

This application claims the benefit of Ser. No. 60/343,929, filed Dec. 28, 2001.

TECHNICAL FIELD OF THE INVENTION

This invention relates to methods of, and devices used for, repackaging semiconductor integrated circuit ("IC") packages, including ball-grid arrays ("BGAs"), quad flat packs ("QFPs"), and dual in-line packages ("DIPs") in order to perform failure analysis ("FA") thereon. More particularly, and not by way of any limitation, the present invention is directed to a method that provides a semiconductor IC sample for FA from the front side or backside using a variety of FA techniques, including electron microscopy ("EM") and externally induced voltage alteration ("XIVA").

BACKGROUND OF THE INVENTION

FA is concerned with analyzing semiconductor IC devices for defects and failure mechanisms. A number of different techniques are available for performing FA on the front side or backside of a semiconductor IC device.

One technique for performing FA on a semiconductor IC device is emission microscopy ("EM"). FA using an emission microscope is performed by collecting visible and near infrared ("NIR") wavelength photons emitted from transistors, junctions, and other photon generating structures on or near the top or front, electrically active, silicon surface. These photons are transmitted through the overlying, relatively transparent dielectric layers, passing between or scattered around the patterned, opaque metal interconnections. Detection of photons that emerge from around these overlying layers is referred to as front side EM analysis. Imaging light passing through the silicon substrate and emerging from the bottom is referred to as backside EM analysis.

The backside of the semiconductor IC device is the exposed surface opposite to that on which active semiconductor devices are fabricated. Backside analysis takes advantage of silicon's transmission of photons with energies less than its indirect silicon band-gap energy. There is an increasing interest in backside EM analysis, which is driven, in part, by the advancement of semiconductor IC fabrication technologies with additional opaque conductor layers and packaging technologies that typically obscure the front side of the die. Restrictions in performing front side analysis is particularly acute with respect to BGA devices. While BGA packages that are fully populated allow more signal pins for a given package footprint, this configuration provides difficulties in using EM equipment for backside analysis.

Traditional backside EM typically requires polishing of the die from the backside and socketing the resultant die sample in a special fixture for inspection with NIR energies through the polished silicon substrate. Semiconductor IC sample preparation for backside analysis requires a semiconductor IC sample to remain in the original package or wafer and be imaged through the bottom of the socket that makes electrical contact to the semiconductor IC. But this method of backside EM analysis is not possible with BGAs with high pin populations.

XIVA comprises another set of techniques for performing FA on a semiconductor IC device and includes, among other techniques, light induced voltage alteration ("LIVA"), thermally induced voltage alteration ("TIVA"), charge induced voltage alteration ("CIVA") and low energy charge induced voltage alteration ("LeCIVA"). These techniques take advantage of a change in voltage across a device under test as a reaction to some energy stimulus. In performing FA using XIVA techniques, a power supply to the semiconductor IC device is placed in constant current mode. The current is adjusted to provide the voltage required for the test or the response required for the voltage monitoring amplifier. The voltage monitoring amplifier is place in parallel with the power supply to monitor the voltage across the semiconductor IC device. The voltage monitoring amplifier is adjusted to null out the constant voltage being supplied by the power supply. When the energy source of the XIVA system is scanned across the semiconductor IC device, any change in voltage across the semiconductor IC device is detected by the voltage monitoring amplifier. The output signal of the voltage monitoring amplifier is fed to an optical microscope or other suitable monitoring device for determination of the location of a defect or other anomaly. Other techniques of FA, described below, include Schleeren Thermal Mapping, picoseconds imaging circuit analysis ("PICA") and laser voltage probe ("LVP").

LIVA and TIVA require backside access to the semiconductor IC device. LIVA utilizes a highly focused light source, generally a laser with a wavelength capable of penetrating the backside of the semiconductor IC device. The wavelength of the light is such that it interacts with the junctions within the semiconductor IC device creating hole-electron pairs in the junctions. In those locations where the circuit is anomalous, the hole-electron pairs combine to set up a current which disrupts the expected results of the circuit. The disruption is detected by the XIVA system.

TIVA also uses a highly focused light source, generally a laser with a wavelength which is capable of penetrating the backside of the semiconductor IC device. The wavelength of the light is such that it does not interact with the junctions. However, the wavelength of the light is such that it is adsorbed by the conductive lines which are constructed within the semiconductor IC device. The light heats up the conductors within the semiconductor IC device causing changes in the resistivity of the interconnections. The changes in resistivity are registered as changes in voltage across the semiconductor IC device. The light intensity is controlled to give the required heating to produce the desired signal which is detected by the XIVA system.

CIVA uses an electron beam to penetrate the top surface of a semiconductor IC device. The metal level within the semiconductor IC device which is activated is dependent upon the energy of the primary electron beam generated by a scanning electron microscope. For example, top level metal may only require 10 KeV to contact. Lower level metal may require 20 KeV. The primary electron beam penetrates to a metal level depositing a charge on that level. A metal line which is not electrically connected to a path to power or ground would float. The change in voltage level on the metal line changes the operation of the complementary CMOS pair in the semiconductor IC device and causes a resultant voltage change at the device power supply which would be detected by the XIVA system.

The LeCIVA technique uses an extremely high current, 200+nA primary electron beam, at low energy, typically 800 eV, to charge the surface of the semiconductor IC device. The gaussian energy distribution of the primary beam creates zones within the beam spot which charge differently. The very high current center charges the surface non-linearly with respect to the lower beam current on the outer edges of the beam spot. On the outer edges, the charging follows the non-linear charging rules for voltage and current by an electron beam. As the beam is scanned across the surface of the semiconductor IC device, the differential charging of the outer edge of the beam and the interior of the beam cause a voltage spike to occur which propagates through the dielectric. Metal lines block the signal. The voltage spike will change the voltage on any metal line which does not have a connection to power or ground. The change in voltage affects the complementary CMOS transistors to which the metal line is connected. Due to the change in current draw of the circuit, a change in voltage is seen across the semiconductor IC device which is detected by the XIVA system.

In Schleeren Thermal Mapping, laser light is used to light the backside of the semiconductor IC device. The reflected light passes across a single sided slit and is imaged on a viewing plane. Because some of the reflected signal is cut offby the slit, the resultant image is subject to interference patterns if there are any anomalies on the surface. Thus, with Schleeren Thermal Mapping, the backside of the semiconductor IC device is assumed to be polished flat and coated with some form of anti-reflective material. A change in the index of refraction of the silicon due to local heating when the semiconductor IC device is powered reveals the anomalies.

PICA images the photon emission of hot electrons injected into the channel of a transistor at the time the transistor is turned on. An optical microscope system with an imaging photo-multiplier is used to focus on a region of the semiconductor IC device, viewing multiple transistors. As the transistors are turned on, photons are focused into the detection system. A database is created correlating the X/Y positions of photon emission to the time of photon generation with respect to a reference signal. The database is used to create images of the transistors turning on with time resolution. Alternatively, a waveform can be created from the photon timing information at each transistor location.

LVP takes advantage of the Frank-Keldysh effect. A laser beam composed of a wavelength of light that is transparent to the silicon is focused on the junctions within the semiconductor IC device from the backside of the device. The wavelength of the laser beam is short enough to interact with the junctions causing some generation of hole-electron pairs. The light is reflected from the semiconductor by the silicide over the diffused areas or the metal in the contacts. The reflected light carries two pieces of information. There is an amplitude change in the reflected light due to changes in the junction and there are changes in phase due to changes in the electric field of the junction. The changes in the junction are due to changes in applied voltage on the junction. A detector system is used to pick up the changes in amplitude and or phase in the reflected light. The detector system converts the signal to a display which represents the voltage change on the junction.

The technology of semiconductor IC device preparation for the above referenced and other modes of FA is beset with various drawbacks and deficiencies. As such, it should be realized that there has arisen a need for a solution that addresses the shortcomings of the current semiconductor IC device preparation techniques. The present invention provides such a solution.

SUMMARY OF THE INVENTION

Accordingly, the present invention advantageously provides a system and method for preparing semiconductor IC devices, particularly BGAs, QFPs and DIPs for FA. Although many types of samples prepared using the disclosed method and invention can be prepared for backside FA, the disclosed method and invention can also be used for front side FA. The disclosed system and method is illustrated using a BGA type package, although other packages are easily adapted for repackaging using the disclosed method and invention. This system and method requires precision thinning and polishing of the semiconductor IC device to expose the backside of the die.

BRIEF DESCRIPTION OF THE DRAWINGS

FIG. 1 illustrates an unmodified BGA IC primary device with a die encapsulated therein;

FIG. 2 illustrates the cross-section of an unmodified secondary package assembly having a closed top and an open bottom providing a cavity therein;

FIG. 3 illustrates the top view of the secondary package assembly lead frame;

DETAILED DESCRIPTION OF THE PRESENT INVENTION

Figure 4:
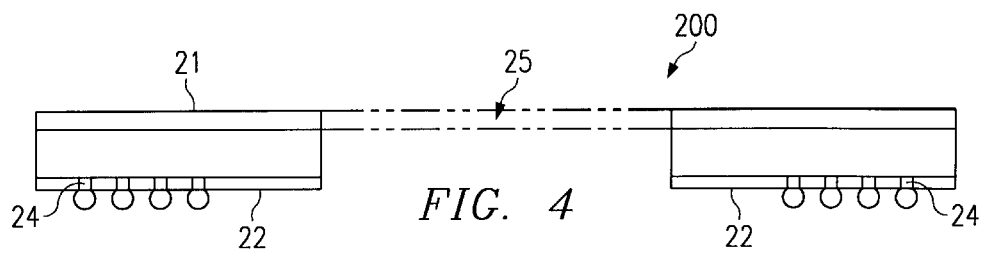
FIG. 4 illustrates e side view of the secondary package assembly having a center portion of the closed top removed to create an aperture therein dimensioned substantially equal to the length and width of the semiconductor die.

In the drawings, like or similar elements are designated with identical reference numerals throughout the several views, and the various elements depicted are not necessarily drawn to scale.

FIG. 1 illustrates an unmodified BGA 100 with a front side 10, a backside 11 and semiconductor die 12 disposed therein. It is the semiconductor die 12 on which FA is to be performed. The semiconductor die 12 disposed in the BGA 100 is attached to a lead frame 13 through a plurality of bond wires 14. Each of the bond wires are bonded to a ball bond 15 on the semiconductor die 12.

FIG. 2 illustrates the cross-section of secondary package assembly 200 prior to modification. The secondary package assembly 200 has a closed top 21, a center portion of the closed top 25 and an open bottom 22 providing a cavity therein. In one embodiment, a Texas Instruments BGA package designated as a 256GGN is used as the secondary package assembly 200. The 256GGN package is designed for a cavity down device configuration which advantageously suits the invention disclosed herein as such system and method of FA requires the removal of the backside 11 of BGA 100 as seen in FIG. 1.

FIG. 3 is a top view of the secondary package assembly 200. As can be seen therein, the secondary package assembly 200 has a lead frame 23. A ground ring 31 and supply ring 32 surround the inner perimeter of the bottom 22 of the secondary package assembly 200.

FIG. 4 is a side view of the secondary package assembly 200. As can be seen therein, a center portion 25 of the secondary package assembly 200 is removed to create an aperture therein dimensioned substantially equal to the length and width of the semiconductor die 12 (seen in FIG. 1). A process such as milling is used to remove the mounting surface of the secondary package assembly 200. Different size secondary package assemblies can be used so as to retain ground ring(s) 31 and supply ring(s) 32 on the center portion 25 of the secondary package assembly 200.

Figure 5:
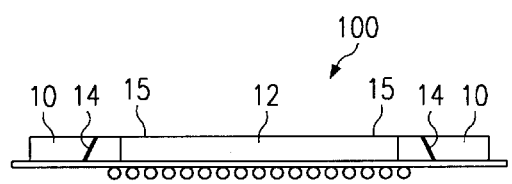
FIG. 5 illustrates one view of the primary package with material removed from the front side to expose the bond wires and ball bonds.

As can be seen in FIG. 5, material is removed from the front side 10 of the BGA 100 to expose the bond wires 14 and the bond balls 15 on the semiconductor die 12. Two parameters must be known to successfully mill the BGA 100 to the proper thickness or height above the semiconductor die 12 surface: the total BGA 100 package height and distance of the semiconductor die 12 surface, relative to the top of the BGA 100 package. This is necessary to avoid damaging the semiconductor die 12, its bond wires 14, or the silicon surface of the semiconductor die 12. BGA 100 can be thinned using a variety of methods and techniques, including but not limited to mechanical lapping, milling, laser thinning, focused ion beam, reactive ion etching, ion milling or sand blasting.

After the milling process has been completed, BGA 100 is removed from the milling tool and lightly polished using any one or a combination of a variety of techniques, generally known to those in the art. The disclosed embodiment utilizes lap polishing techniques to polish the BGA 100.

Figure 6:
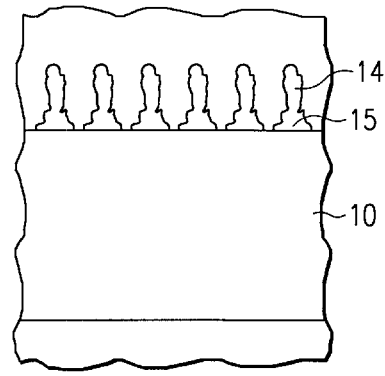
FIG. 6 illustrates a magnified view of the exposed bond wires and ball bonds through e substrate of the primary package.

FIG. 6 shows a magnified view of the bond wires 14 and ball bonds 15 on the primary package, in this case BGA 100.

Figure 7:
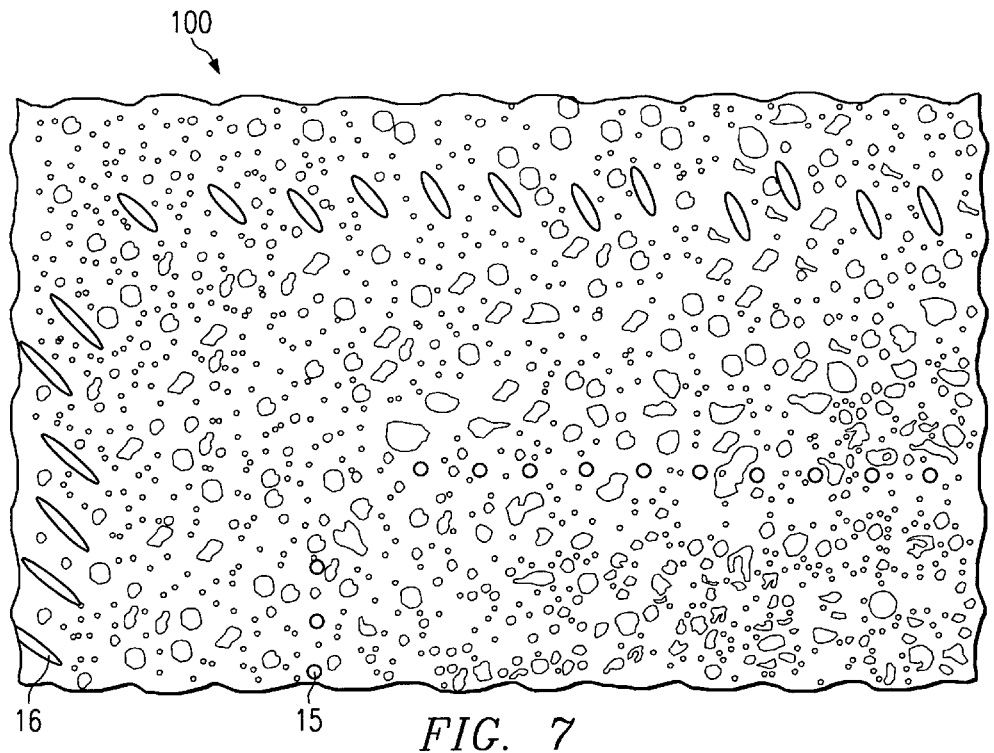
FIG. 7 illustrates a magnified top view of the primary package showing the exposed bonds wires and ball bonds.

FIG. 7 shows a magnified view of the front side of the semiconductor die 12 after milling and polishing. The polishing process provides a smooth surface on the ball bonds 15, which allows a bonding tool to attach bond wires 17 from the ball bonds 15 to the lead frame 23 on the secondary package assembly 200. The inner ring of contacts are the ball bonds 15 that remain connected to the semiconductor die 12. The outer ring of contacts 16 are the portions of the bond wires 14 that connect to the lead frame 13 of the primary package BGA 100. The semiconductor die 12 remains encapsulated in mold compound. This provides stability and protects the semiconductor die 12 surface from any damage during the remaining processes. A stiffener can be added to the semiconductor die 12 to improve the stability of the die 12.

Figure 8:
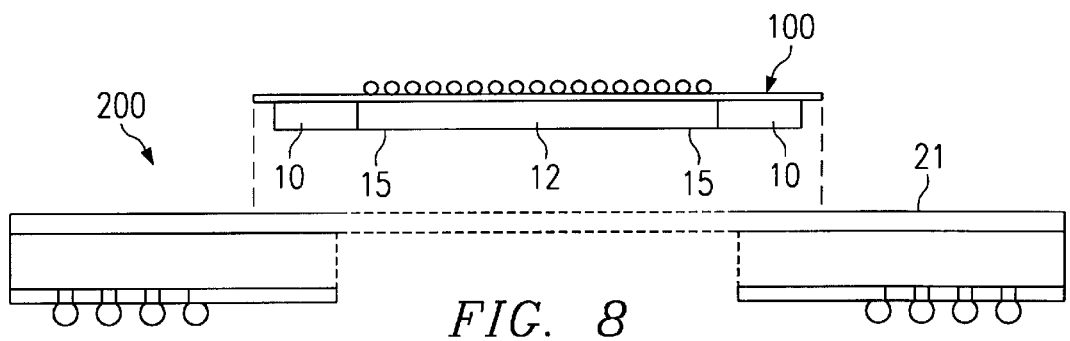
FIG. 8 illustrates the orientation of the thinned primary package to the secondary package assembly for mounting.

FIG. 8 indicates the orientation of the thinned BGA 100 to the secondary package assembly 200 for mounting. The front side 10 of the thinned BGA 100 is mounted to the top of the secondary package assembly 200 such that the perimeter of the aperture and the perimeter of the semiconductor die 12 are substantially aligned, recreating a cavity in the secondary package assembly 200. A plurality of wires 17 are attached from the exposed ball bonds 15 on the semiconductor die 100 to the lead frame 23 of the modified secondary package assembly 200.

Figure 9:
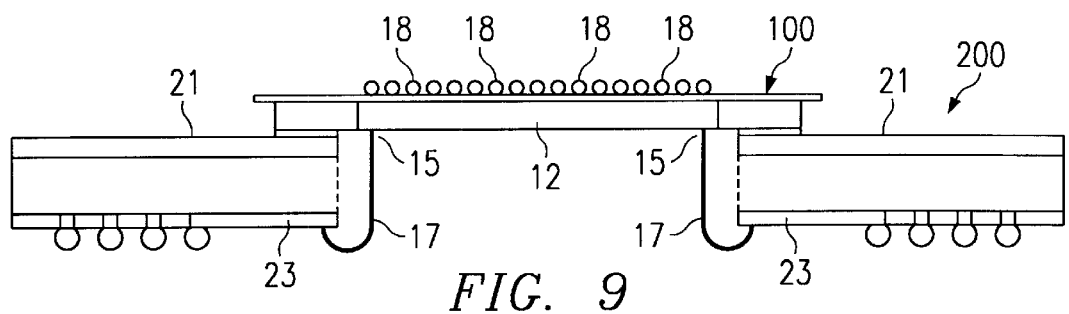
FIG. 9 illustrates the mounted front side of the thinned primary package to the top of the secondary package assembly such that the perimeter of the aperture and the perimeter of the semiconductor die are substantially aligned, recreating a cavity in the secondary package assembly.

As can be seen in FIG. 9, BGA 100 is mounted to the top of the secondary package assembly 200 such that the ball bonds 15 are visible and can be accessed for rebonding through the cavity area. The bond wires 17 are connected through the hole of the secondary package assembly 200 in a cavity-down configuration. When the BGA 100 and secondary package assembly 200 have been bonded together, the rebonding process commences. The newly created package is mounted in a mechanical bonding tool, and the bond wires 17 are connected from the ball bonds 15 to the lead frame 23.

Figure 10:
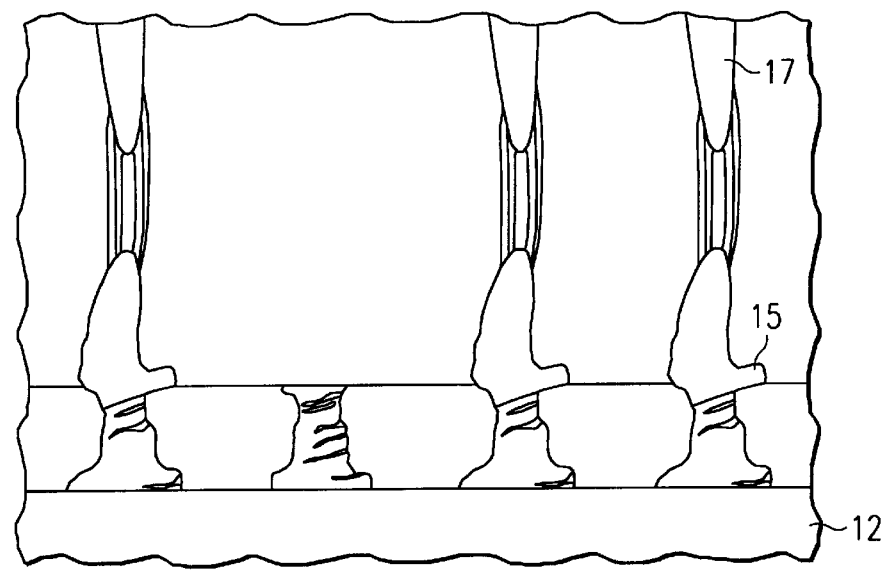
FIG. 10 illustrates the attachment of bond wires between the exposed ball bonds of the primary package and the secondary package assembly.

FIG. 10 provides a magnified view of the attachment of the ball bonds 15 to the secondary package assembly 200 using bond wires 17.

Figure 11:
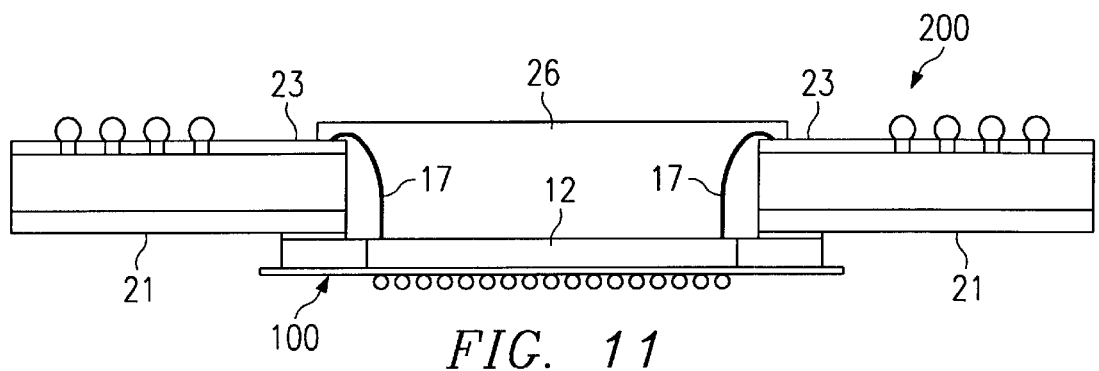
FIG. 11 illustrates the repackaged primary package mounted on the secondary package assembly with the cavity created by the secondary package assembly and the thinned primary package having been filled with a substantially rigid material.

As illustrated in FIG. 11, after the repackaged BGA 100 is mounted on the secondary package assembly 200 with the cavity created by the modified secondary package assembly 200 and the thinned BGA 100, the cavity is filled with a substantially rigid material 26, such as an epoxy or mold compound for die 12 and bond wire 17 stability.

Figure 12:
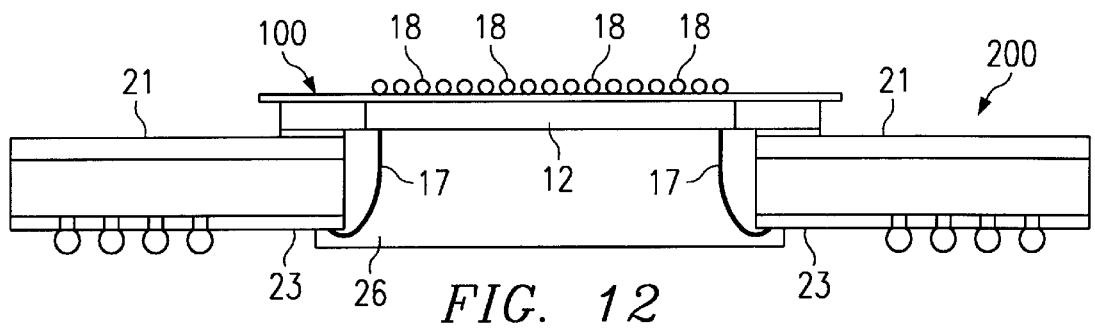
FIG. 12 illustrates the repackaged primary package mounted on the secondary package assembly oriented for further thinning.

FIG. 12 shows the orientation of the repackaged BGA 100, as mounted on the secondary package assembly 200 for further thinning of the semiconductor die 12.

Figure 13:
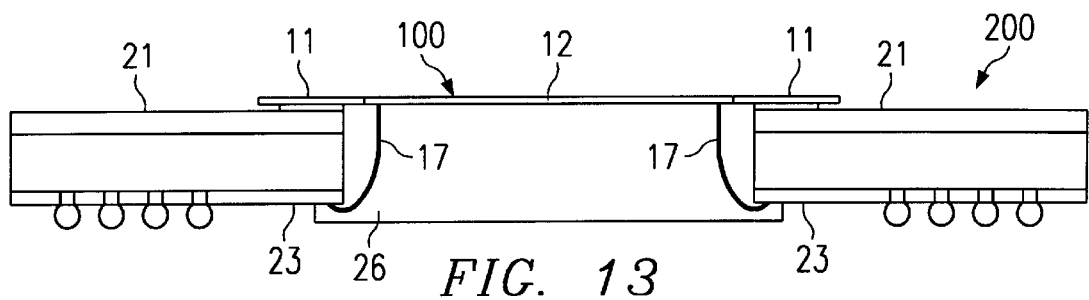
FIG. 13 illustrates the repackaged primary package mounted on the secondary package assembly, the primary package's backside having been further thinned to a desired thickness for FA.

FIG. 13 illustrates the repackaged BGA 100 mounted on the modified secondary package assembly 200, the backside 11 having been further thinned to a desired thickness for FA. Specifically, the solder balls 18 are removed to a point that is level with the substrate film. The backside of the semiconductor die 12 is further milled and polished until the remaining silicon has an approximate thickness of 100 microns. Milling to about 125 microns, then polishing the remaining 25 microns away assures a polished silicon surface. Improved results for FA are obtained if the silicon surface is evenly polished with no ridges or scratches, as ridges and scratches on the silicon surface disperse the emitted photons, providing less direct photon emissions for detection during FA and testing.

While the mechanical work of repackaging, milling and polishing of the BGA 100 is being performed, pin to pin mapping of the primary package 100 to the secondary assembly package 200 is performed. This is undertaken to make the primary package 100 electrically behave like the secondary package assembly 200. This requires reassignment of the connections between die pads of the primary package 100 and bond fingers of the lead frame 23. Once completed, it allows the primary package 100 to be tested while contained in the modified secondary package assembly 200. The modified secondary package assembly 200 with the attached thinned BGA 100 is inserted in a test socket, and a modified test program is run. Once the datalogs for the newly repackaged device represent electrical characteristics identical to the original failing characteristics, further backside polishing of the semiconductor die 12 can be undertaken. This process can also be used on a variety of packages such as QFPs and DIPs, in order to perform FA.

Once the semiconductor device has been repackaged, a variety of FA methods can be used thereon from the backside or the front side, including EM, LIVA, TIVA, CIVA, LeCIVA, Schleeren Thermal Mapping, PICA or LVP. Based on the foregoing, it should be appreciated by those skilled in the art that the present invention provides an innovative solution that overcomes the drawbacks and deficiencies of the existing sample preparation technologies for FA. The innovative teachings of the present application are described with particular reference to the disclosed embodiment using a 256GGN secondary package assembly and a BGA primary package. However, it should be understood that this embodiment provides only one example of the many advantageous uses and innovative teachings herein. Various alterations, modifications and substitutions can be made to the disclosed invention without departing in any way from the spirit and scope of the present invention, as defined in the claims that follow.

What is claimed is:

1. A method of preparing a semiconductor sample using a primary package with a semiconductor die disposed therein and a secondary package assembly, the primary package having a front side and a backside, the semiconductor die disposed in the primary package having a plurality of ball bonds attached to a substrate and lead frame through a plurality of bond wires, the secondary package assembly having a closed top and an open bottom providing a cavity therein, the secondary package assembly having a lead frame connecting to a plurality of exposed conducting points on the bottom of the secondary package assembly, the method comprising the steps of:

removing a portion of the secondary package assembly closed top to create an aperture therein;

thinning the primary package from the front side to remove the bond wires and expose the ball bonds;

mounting the front side of the thinned primary package to the top of the secondary package assembly such that the semiconductor die is accessible via the aperture;

attaching a plurality of wires between the exposed ball bonds on the semiconductor die and the lead frame of the secondary package assembly;

filling the cavity created by the secondary package assembly and the thinned primary package with a material; and thinning the backside of the thinned primary package to a desired thickness.

2. The method of preparing a semiconductor sample as recited in claim 1, wherein the thinning of the backside of the primary package exposes the semiconductor die.

3. The method of preparing a semiconductor sample as recited in claim 1, wherein the portion of the secondary package assembly which is removed to create an aperture therein is dimensioned substantially equal to the length and width of the semiconductor die.

4. The method of preparing a semiconductor sample as recited in claim 1, wherein the front side of the thinned primary package is mounted to the top of the secondary package assembly such that the perimeter of the aperture and the perimeter of the semiconductor die are substantially aligned.

5. The method of preparing a semiconductor sample as recited in claim 1, wherein the step of thinning the primary package comprises mechanical lapping.

6. The method of preparing a semiconductor sample as recited in claim 1, wherein the method of thinning the primary package comprises milling.

7. The method of preparing a semiconductor sample as recited in claim 1, wherein the method of thinning of the primary package utilizes laser thinning techniques.

8. The method of preparing a semiconductor sample as recited in claim 1, wherein the method of thinning the primary package utilizes focused ion-beam techniques.

9. The method of preparing a semiconductor sample as recited in claim 1, wherein the method of thinning the primary package utilizes reactive ion etching.

10. The method of preparing a semiconductor sample as recited in claim 1, wherein the method of thinning the primary package comprises ion milling.

11. The method of preparing a semiconductor sample as recited in claim 1, wherein the method of thinning the primary package comprises sand blasting.

12. The method of preparing a semiconductor sample as recited in claim 1, further comprising the step of polishing the backside of the primary package.

13. The method of preparing a semiconductor sample as recited in claim 1, wherein the primary package comprises a ball grid array.

14. The method of preparing a semiconductor sample as recited in claim 1, wherein the primary package comprises a quad flat pack.

15. The method of preparing a semiconductor sample as recited in claim 1, wherein the primary package comprises a dual in-line package.

16. The method of preparing a semiconductor sample as recited in claim 1, wherein the secondary package assembly comprises a multilayered substrate BGA package assembly.

17. The method of preparing a semiconductor sample as recited in claim 16, wherein the multilayered substrate BGA package assembly contains a heat sink.

18. The method of preparing a semiconductor sample as recited in claim 16, wherein the multilayered substrate BGA package assembly contains a plurality of conductive supply and ground rings located around an inner portion of the secondary package assembly leadframe.

19. The method of preparing a semiconductor sample as recited in claim 14, wherein the plurality of conductive supply and ground rings remain intact when the portion of the closed top of the secondary package assembly is removed to create an aperture.

20. The method of preparing a semiconductor sample as recited in claim 1, wherein the final thickness of the thinned primary package is approximately 75 microns to 150 microns.

21. The method of preparing a semiconductor sample as recited in claim 1, wherein a substantially rigid material is used to fill the cavity created by the secondary package assembly and the thinned primary package.

22. The method of preparing a semiconductor sample as recited in claim 21, wherein the substantially rigid material used to fill the cavity created by the secondary package assembly and the thinned primary package comprises room temperature epoxy.

23. The method of preparing a semiconductor sample as recited in claim 21, wherein the substantially rigid material used to fill the cavity created by the secondary package assembly and the thinned primary package comprises glob top epoxy.

24. The method or preparing a semiconductor sample as recited in claim 1, further comprising the step of performing failure analysis on the semiconductor sample.

25. The method of performing failure analysis on a semiconductor sample as recited in claim 24, wherein the method comprises XIVA.

26. The method of performing failure analysis on a semiconductor sample as recited in claim 24, wherein the method comprises LIVA.

27. The method of performing failure analysis on a semiconductor sample as recited in claim 24, wherein the method comprises TIVA.

28. The method of performing failure analysis on a semiconductor sample as recited in claim 24, wherein the method comprises CIVA.

29. The method of performing failure analysis on a semiconductor sample as recited in claim 24, wherein the method comprises LeCIVA.

30. The method of performing failure analysis on a semiconductor sample as recited in claim 24, wherein the method utilizes Schleeren Thermal Mapper.

31. The method of performing failure analysis on a semiconductor sample as recited in claim 24, wherein the method comprises PICA.

32. The method of performing failure analysis on a semiconductor sample as recited in claim 24, wherein the method comprises LVP.

33. The method of performing failure analysis recited on a semiconductor sample as recited in claim 24, wherein failure analysis is accomplished using emission microscopy.

34. The method of performing failure analysis on a semiconductor sample as recited in claim 24, wherein the failure analysis occurs on the backside of the semiconductor sample.

35. The method of preparing a semiconductor sample and performing backside failure analysis recited in claim 34, further comprising the step of removing additional material from the backside of the semiconductor sample during backside failure analysis.

36. The method of performing backside analysis as recited in claim 24, further comprising the step of performing failure analysis on the front side of the semiconductor sample.

37. The method of preparing a semiconductor sample as set forth in claim 1, further comprising the step of bonding the primary package to a stiffener prior to mounting the thinned primary package to the secondary package assembly.

* * * * *